(12) United States Patent
Zhang et al.

(10) Patent No.: US 8,446,193 B2
(45) Date of Patent: May 21, 2013

(54) APPARATUS AND METHOD TO HOLD PLL OUTPUT FREQUENCY WHEN INPUT CLOCK IS LOST

(75) Inventors: Ben-yong Zhang, Auburn, WA (US); Tom Christiansen, Federal Way, WA (US); Christopher Andrew Schell, Tacoma, WA (US)

(73) Assignee: National Semiconductor Corporation, Santa Clara, CA (US)

( * ) Notice: Subject to any disclaimer, the term of this patent is extended or adjusted under 35 U.S.C. 154(b) by 92 days.

(21) Appl. No.: 13/099,253

(22) Filed: May 2, 2011

(65) Prior Publication Data

US 2012/0280735 A1 Nov. 8, 2012

(51) Int. Cl.
*H03L 7/06* (2006.01)

(52) U.S. Cl.
USPC ........................................... 327/156; 327/147

(58) Field of Classification Search
USPC .................................................. 327/147, 156
See application file for complete search history.

(56) References Cited

U.S. PATENT DOCUMENTS

| | | | |
|---|---|---|---|
| 5,473,274 A | 12/1995 | Reilly | |
| 6,028,460 A | 2/2000 | McCollum | |
| 6,236,278 B1 | 5/2001 | Olgaard | |
| 6,670,852 B1 | 12/2003 | Hauck | |
| 7,148,753 B1* | 12/2006 | Garlepp et al. | 331/2 |
| 7,323,946 B2* | 1/2008 | Seefeldt et al. | 331/25 |
| 8,306,176 B2* | 11/2012 | Staszewski et al. | 375/376 |
| 2001/0015678 A1* | 8/2001 | Wesolowski | 331/14 |
| 2002/0180498 A1* | 12/2002 | O'Leary et al. | 327/156 |
| 2002/0190764 A1* | 12/2002 | Nichols | 327/156 |
| 2004/0164776 A1* | 8/2004 | Zampetti et al. | 327/156 |
| 2005/0189972 A1* | 9/2005 | Foo et al. | 327/156 |
| 2005/0242852 A1* | 11/2005 | Parker et al. | 327/156 |
| 2007/0182467 A1* | 8/2007 | Nakamuta | 327/156 |
| 2008/0191762 A1* | 8/2008 | Seethamraju et al. | 327/158 |
| 2010/0123496 A1* | 5/2010 | Palmer et al. | 327/158 |
| 2011/0228424 A1* | 9/2011 | Dahle et al. | 360/134 |
| 2012/0119801 A1* | 5/2012 | Hsieh et al. | 327/156 |
| 2012/0126866 A1* | 5/2012 | Hsieh et al. | 327/157 |

* cited by examiner

*Primary Examiner* — Adam Houston
(74) *Attorney, Agent, or Firm* — Andrew S. Viger; Wade J. Brady, III; Frederick J. Telecky, Jr.

(57) ABSTRACT

A clock conditioning circuit including a phase detector circuit configured to provide an analog tuning signal indicative of a phase relationship between a reference clock to be conditioned and a generated clock. The controlled oscillator is configured to produce the generated clock, with the generated clock having an output frequency adjustable in response to an analog tuning signal applied to a control signal input of the controlled oscillator. Converter circuitry is provided to produce a digital representation of the analog tuning signal when the mode control circuitry is in a tracking mode. In the event the reference clock is lost, the mode control circuitry switches to a holdover mode so as to provide an analog holdover signal to the control signal input based upon the digital representations produced just prior to the loss of the reference clock.

24 Claims, 5 Drawing Sheets

APPARATUS AND METHOD TO HOLD PLL OUTPUT FREQUENCY WHEN INPUT CLOCK IS LOST

BACKGROUND OF THE INVENTION

1. Field of the Invention

The present invention relates generally to clock generating circuitry and, in particular, to circuitry for maintaining the frequency of an output clock when the input clock is lost.

2. Description of Related Art

For wired and wireless network applications, the recovered clock from a serial communications link is typically noisy and needs to be cleaned up by a clock conditioner or clock jitter cleaner. The outputs of a clock conditioner are used to provide low noise clock sources for other system function blocks such as analog to digital converters (ADC), digital to analog converters (DAC), serializer/deserializer devices (SERDES) and the like. In such applications, the input clock to the clock conditioner may be lost due to failures in the communication link such as a broken wire, failure of the SERDES device and the like. When the input clock is lost, it is typically required by the communication system that the clock conditioner maintain precise output frequencies for long periods of time such as several days or even longer.

FIG. 1 shows a typical prior art clock conditioning circuit that is essentially a phase locked loop (PLL). A clock CLKR to be conditioned, sometimes referred as a reference clock, is fed to one input of a phase frequency detector 16. Clock CLKR may be divided down in frequency by a divider 18. A conditioned clock CLKO is fed to a second input of phase detector 16, where an optional frequency divider 20 can also be used. Frequency dividers 18 and 20 allow the frequencies of the two clocks CLKR and CLKO to differ but still be maintained in phase with one another. Phase detector 16 is typically comprised of a pair of D type flip flops with one flip-flop being set by the rising edge of CLKR (or the divided version of CLKR) and the other being set by the rising edge of CLKO (or the divided version of CLKO). Once both flip-flops are set, both are reset at the same time following a small delay. Thus, if the two clocks are in phase, the rising edges will be concurrent so that simultaneous narrow pulses will be produced at the two detector outputs. If the rising edge of CLKR precedes that of CLKO, the pulse width of output UP will be greater than the narrow pulse width of output DN with the difference in duration relating to the time difference of the rising edges. Conversely, if the rising edge of CLKR follows that of CLKO, then the pulse width of output DN will be greater than that of output UP, with the difference in width again being a function of the rising edge time difference.

The two outputs UP and DN are coupled to the respective inputs of a charge pump circuit 22, with circuit 22 including a high side pump component 22A controlled by signal UP and a low side pump component 22B controlled by signal DN. Details of the charge pump circuit 22 are shown in FIG. 2. The high side component 22A includes a current source 34A which can be switched to a pump output 24 by way of a switch 36A controlled by signal UP. The low side component 22B includes a current source 34B which can be switched to the pump output 24 by way a switch 36B controlled by signal DN. The two current sources 36A and 36B are of equal magnitude, with current source 34A sourcing current to output 24 and current source 34B sinking current from the output. As will be described, the output 24 of the charge pump 22 is connected to a low pass filter which operates to essentially integrate the current pulses provided by the charge pump components 22A and 22B.

Returning to FIG. 1, as previously noted, the output of the charge pump circuit is filtered by a low pass filter 26. Filter 26 is typically in the form of a single capacitor connected between output 24 and the circuit common connected in parallel with a series-connected capacitor and resistor combination. Thus, the output of the filter on line 30 is directly connected to the filter input on line 24. The filter output on line 30 is an error or tuning signal which is provided to the control input of the crystal based voltage controlled oscillator (VCXO) 28. As is well known, a voltage controlled oscillator provides an output signal having a frequency which can be varied in response to changes in a control input (tuning signal), with instantaneous changes in frequency corresponding to a change in phase. Oscillator 28 is configured to provide a clock CLKO which it in phase with the reference clock CLKR based upon the magnitude of the input tuning signal. Note that phase noise beyond the PLL loop bandwidth present on clock CLKR is substantially cleaned from clock CLKO.

As previously noted, in the event the reference clock signal CLKR is missing for some reason, many systems require that the clock conditioning circuitry maintain the frequency at the correct value for extended periods of time. One prior art approach is to force the output 24 to a high impedance. FIG. 3 depicts an alternative prior art charge pump circuit 44 which includes an upper component 44A and a lower component 44B. The construction of charge pump 44 is similar to that of charge pump 22 and includes upper and lower current sources 34A and 34B and associated switches 36A and 36B. The alternative charge pump 44 further includes isolation switches 38A and 38B that are closed during normal charge pump operation. In the event of the loss of the reference clock CKLR, a loss of clock detector (not depicted) will generate a hold signal VHO1 which will operate to open switches 38A and 38B thereby isolating the outputs of the charge pump 44 from output line 24/30. The tuning voltage on line 24, at the time of the loss of CKLR will tend to be maintained by the low pass filter which is essentially a capacitance connected between line 24 and ground. Thus, the tuning voltage to the control input to the VCXO on line 24/30 will be held in place so that the frequency output of VCXO 28 is maintained. However, the tuning voltage will change primarily due to leakage currents represented by element 46. These leakage currents may be attributable to the leakage current in the charge pump output, or the VCXO input or leakage through the capacitors of low pass filter 26 and can be on the order of 1 nA or larger. Assuming that the tuning voltage is about 1.65 V (VDD/2 or 3.3V/2) and assuming that the effective capacitance between line 24/30 and ground is about 10 µF, then two hours after the loss of CKLR the tuning voltage will drop by 0.93 volts. Assuming that the frequency gain Kvcxo of VXCO is 100 ppm/V, the output frequency will drift 72 ppm in just two hours.

In order to further reduce the change in frequency after a loss of a reference clock, another prior art approach is to first isolate the output of the charge pump circuit as previously described by opening switches 38A and 38B in response to signal VHO1. In addition, after line 24/30 has been isolated from the charge pump circuit 44 a fixed voltage VDD/2 is applied to line 24/30. Voltage VDD/2, which typically is the nominal VCXO tuning voltage, is provided by a buffer circuit 42 when switch 40 is closed in response to a signal VHO2 which is produced along with signal VHO1 when a loss of the reference clock CLKR is detected. Unfortunately, this approach is not capable of holding an accurate output frequency over changes in supply voltage, ambient temperature and VCXO tuning characteristic variations. For example, lab testing has confirmed that, even when changes in the VCXO tuning characteristics are not considered, the output frequency can vary between −10 ppm and +30 ppm for a typical commercial VCXO when its tuning voltage is held at VDD/2 and the supply voltage is varied between +3.15V and +3.45V and the ambient temperature is varied between −40 C and +85 C.

There is a need for a clock conditioning system which includes a phase locked loop which is capable of accurately maintaining an output clock frequency over extended periods of time after the input or reference clock has been lost. As will become apparent to those skilled in the art upon a reading of the following Detailed Description of the Invention together with the drawings, the present invention provides this improved capability.

DETAILED DESCRIPTION OF THE INVENTION

Figure 1:
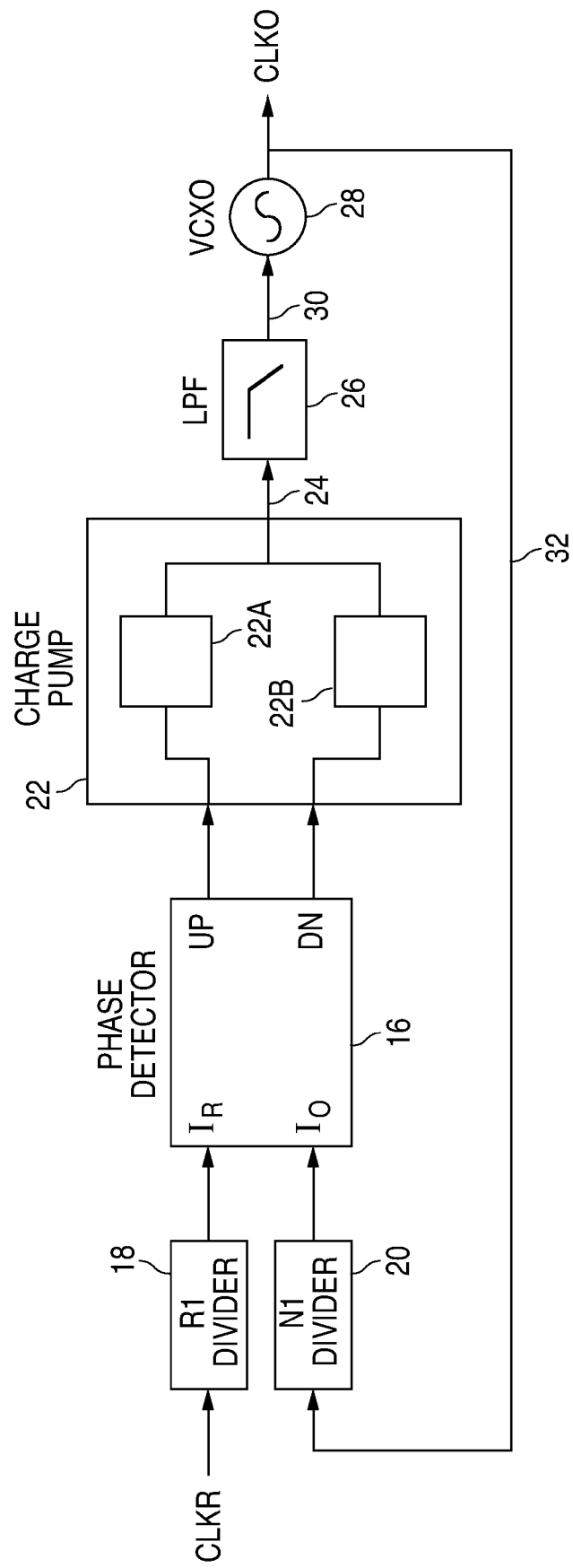
FIG. 1 is a block diagram of a prior art clock conditioning circuit utilizing a phase locked loop.
Figure 3:
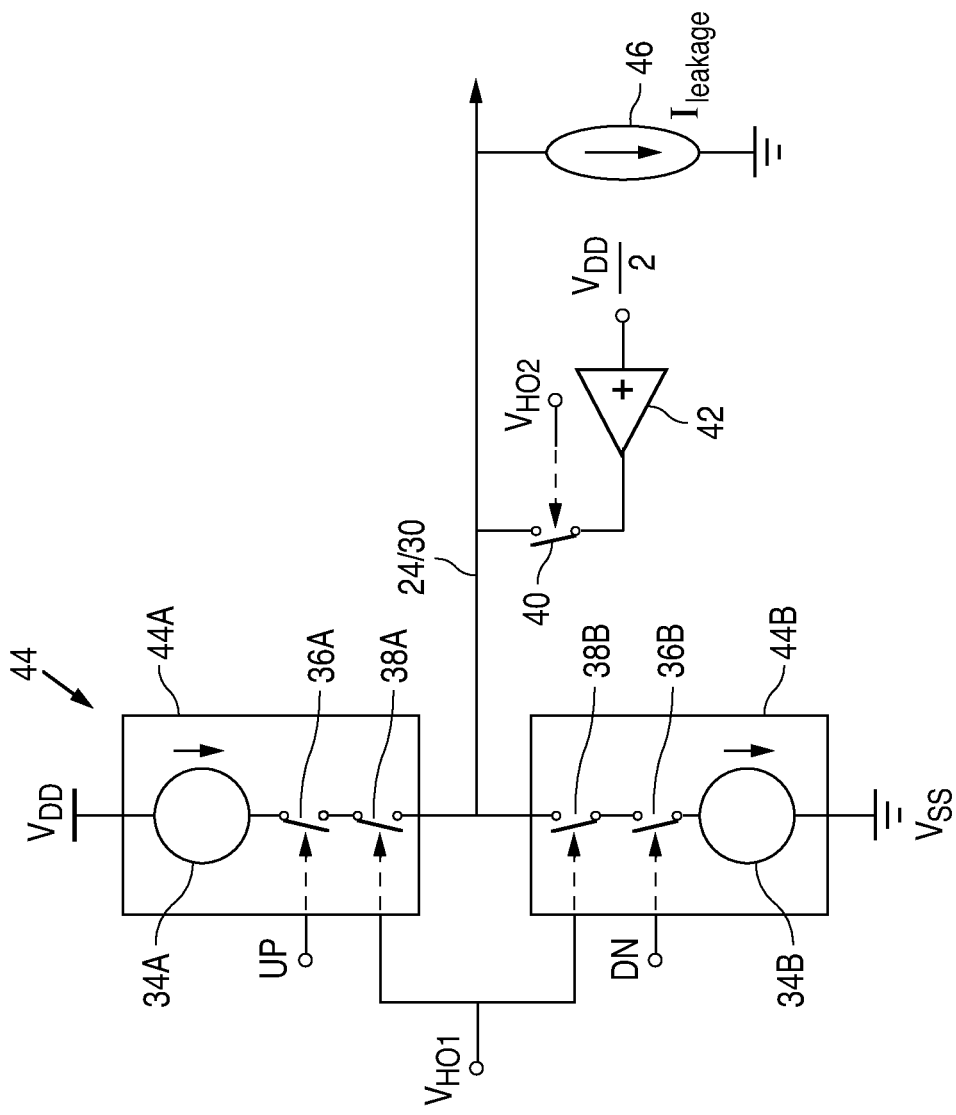
FIG. 3 is a diagram of another prior art charge pump circuit illustrating various attempts to maintain a clock output frequency after a loss of the input clock.
Figure 2:
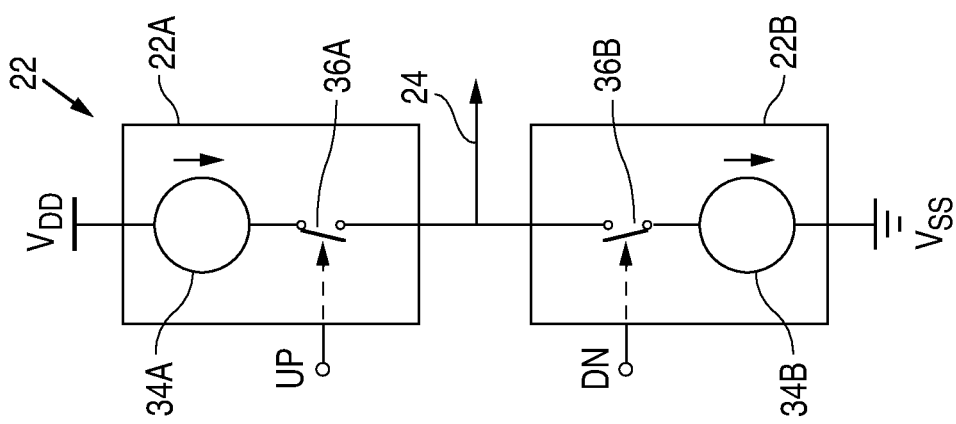
FIG. 2 is a diagram of a prior art charge pump circuit used in the FIG. 1 clock conditioning circuit.
Figure 4:
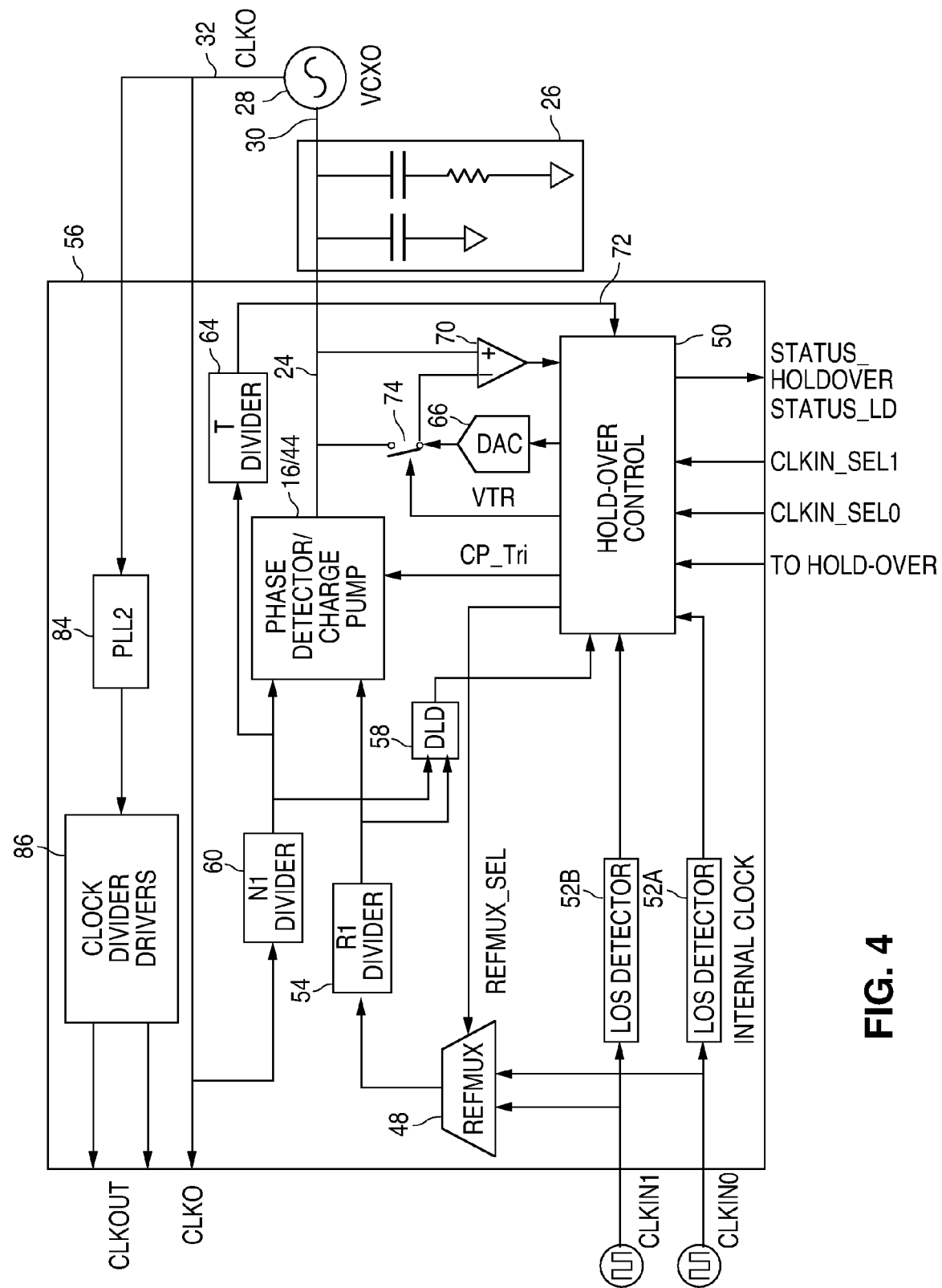
FIG. 4 is a diagram of a clock conditioning system which utilizes one embodiment of the present invention.

Referring again to the drawings, FIG. 4 shows a clock conditioning system including a PLL which utilizes one embodiment of the present invention. The system includes circuitry for two reference clocks CLKIN1 and CLKIN0 which are coupled to the inputs of a multiplexer 48, with one clock acting as the backup for the other. One of the two clocks is selected by a signal originating from a Holdover Control block 50 in response to signals CLKIN_SEL0 and CLKIN_SEL1. Each of the two clocks has an associated loss of signal detector 52A and 52B, with the outputs of the two detectors being sent to the Holdover Control block 50. One of the two reference clocks is selected for normal operation and is connected to the input of a phase locked loop (PLL) as will be described. The selected reference clock is provided to a frequency divider 54 with the divided clock being provided to one input of a phase detector/charge pump circuit 16/44, with the charge pump circuit being similar to circuit 44 of FIG. 3. The divided clock output is also fed to the input of a digital lock detector (DLD) 58 used for detecting the PLL lock status. The analog output on line 24/30 of phase detector/charge pump circuit 16/44 acts as a tuning voltage for VCXO 28. Note that VCXO 28 can also, by way of further example, be implemented by a discrete, voltage-tunable crystal oscillator or by a non-crystal based VCO.

Once again, a low pass filter 26 is provided which integrates the output of the charge pump circuit. The tuning voltage controls the frequency of the output clock CLKO on line 32 which is fed back to the other input of the phase detector input by way of divider circuit 60. The feedback clock is also coupled to another input of the digital lock detector (DLD) 58. As is well known, the tuning voltage adjusts the instantaneous frequency of clock CLKO so that when the loop is locked, the phase difference between the selected reference clock CLKIN1/CLKIN0 and the output clock CLKO is reduced to some minimum value. Further, phase noise of the reference clocks beyond the PLL loop bandwidth is also substantially reduced.

As will be explained in greater detail, the clock conditioning system of FIG. 4 has two basic operating modes. Normally, when the selected reference clock (CLKIN1 or CLKIN0) is operational, the system is placed in a tracking mode of operation. In that mode, the PLL is fully operational, including the charge pump circuit. The tuning voltage on line 24/30 is monitored using an ADC so as to produce a digital representation of the tuning voltage. The digital representation tracks the analog tuning voltage throughout the tracking mode. In the event the selected reference clock fails, the clock conditioning system is switched from the tracking mode to a holdover mode. More details on the switching between the tracking mode and the holdover mode are discussed later. In the holdover mode, the digital representation of the tuning voltage produced just prior to the loss of the reference clock is held. The held digital representation is used in conjunction with a DAC to produce a substitute fixed tuning signal so that the VCXO produces an output clock CLKO of the same frequency of the clock just prior to the loss of the reference clock. The output of the charge pump circuit is isolated from the DAC output charge pump circuit so that the charge pump output does not interfere with the substitute tuning signal produced by the DAC. By way of example, this isolation can be achieved by opening switches 38A and 38B of the FIG. 3 charge pump circuit.

Figure 5:
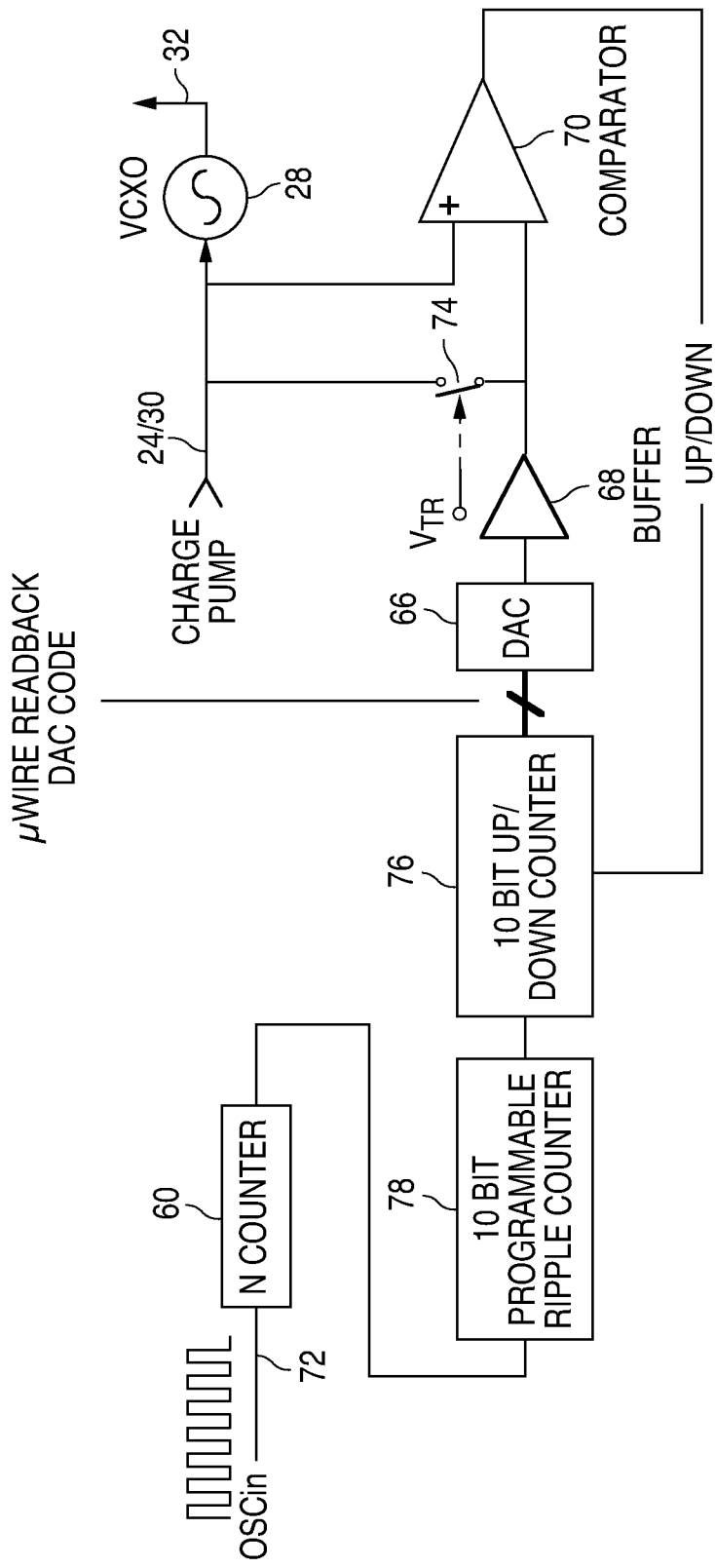
FIG. 5 is a diagram of the part of the FIG. 4 clock conditioning system, including the DAC used in the conditioner holding mode, with the DAC further acting as part of the ADC used in the conditioner tracking mode.
Figure 6:
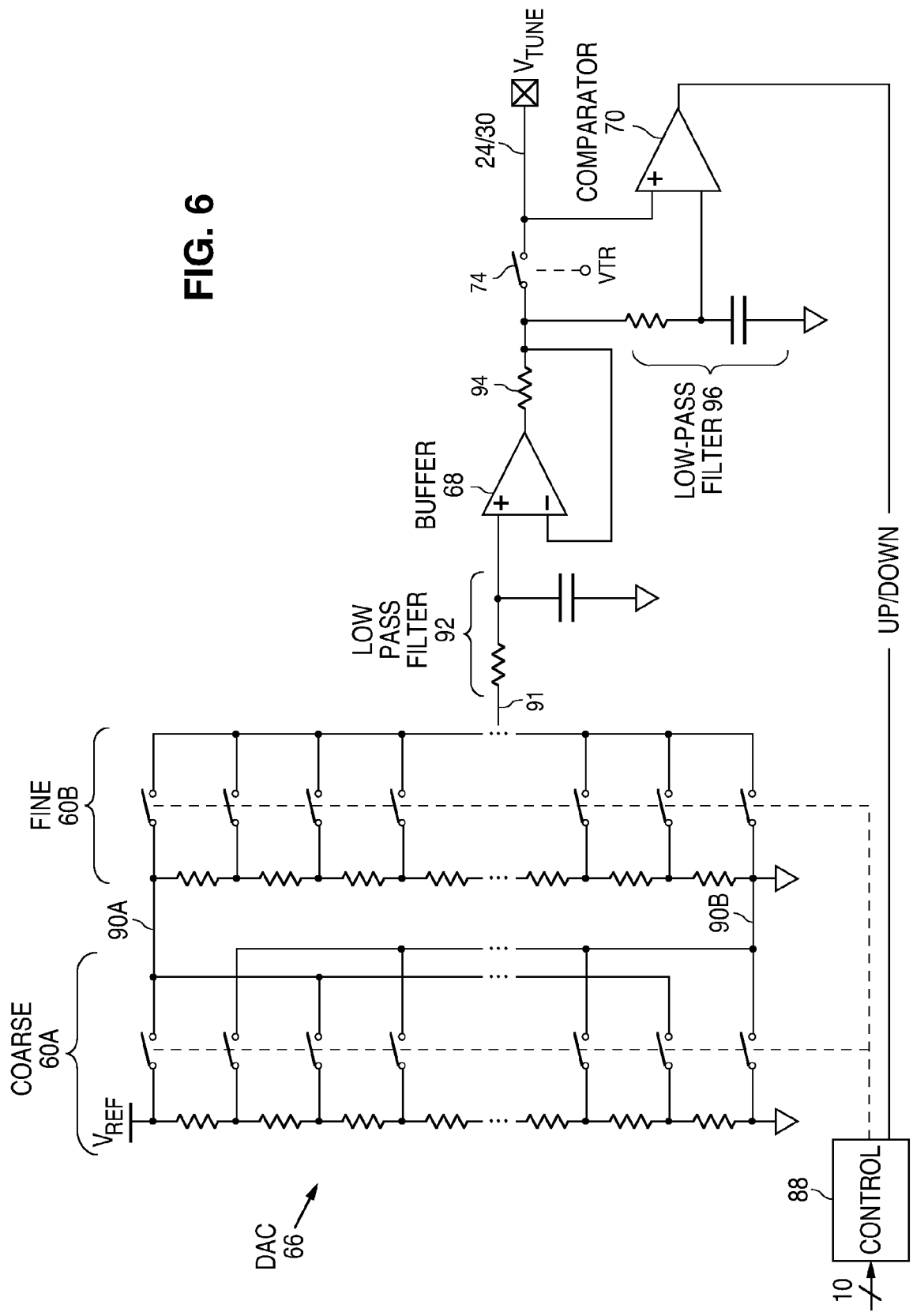
FIG. 6 shows some of the details of the DAC of FIG. 5.

When in the tracking mode, the PLL including the charge pump, is fully operational, with a signal CP_Tri produced by control block 50 for isolating the charge pump output, being in a de-asserted state. The output of a DAC 66 of FIGS. 4, 5 and 6 is isolated from tuning voltage line 24/30 by an open switch 74. As is known in the prior art, a DAC can be used in combination with an up/down counter and comparator to create an ADC circuit. In the tracking mode, DAC 66 forms part of an ADC circuit as shown in FIG. 5. A comparator 70 compares the magnitude of the tuning voltage on line 24/30 to the buffered output of DAC 66. In the event the analog output of ten bit DAC 66 is less than the tuning voltage, comparator 70 switches an Up/Down counter 76 to the count up mode. The counter, which is continuously clocked by a ten bit programmable ripple counter 76, will count up to a new value which will cause the output of DAC 66 to increase. Eventually, the increase value of the DAC 66 output will cause comparator 70 to switch states so that the up/down counter 76 will count down. Thus, the ten bit DAC 66 digital input provided by counter 76 will track the analog tuning voltage. Note that the digital signal will continuously change by one LSB even when the tuning voltage is constant. DAC 66 update rate is at a programmable clock rate equal to the N1 divider 60 (FIG. 4) output divided by a programmable value using ripple counter 78. The speed of DAC 66 only needs to be fast enough to track the VCXO tuning voltage when the tuning voltage has settled.

Multiple approaches can be used for switching the clock conditioner system from the tracking mode to the holdover mode. One approach is to switch is response to an externally generated signal "To Holdover". For example, an FPGA or a Micro-controller can assert the "To Holdover" signal to force the PLL into the holdover mode when it determines that the input clock to the PLL has failed. A second approach is to switch when the PLL transitions from a lock status to an unlocked status as determined by DLD 58 or when detectors 52A and 52B indicate that the selected reference clock has failed. Signal CP_Tri is asserted so as to isolate the output of the charge pump circuit from the tuning voltage line 24/30. The digital output of counter 76 is held during this mode so that the analog output remains fixed. In addition, signal Vtr is asserted by block 50 so that switch 74 connects the analog DAC 66 output to the tuning voltage line 24/30 so that VCXO 28 will produce a clock CLKO of the same frequency of the clock just prior to the loss of the reference clock.

Similarly, multiple approaches can be used for switching the clock conditioner system from the holdover mode back to the tracking mode. One approach is to switch back in response to an externally generated signal "To Holdover". For example, a FPGA or a Micro-controller can de-assert signal "To Holdover" to force the PLL back to the tracking mode when it determines the input clock to the PLL is valid. A second approach is to switch back when DLD 58 determines that the difference between the input clock frequency and the holdover clock frequency is small enough or the selected reference clock is valid. Should the conditions for switching the clock conditioner system from the holdover mode back to the tracking mode be met, the conditioning system will revert back to the tracking mode where normal PLL operation is resumed.

Note that for many applications, a second PLL 84 following the first PLL is preferably used to multiply the VCXO CLKO frequency to a higher frequency signal. That signal can then be divided by divider circuitry 86 to generate multiple clock outputs at desired frequencies. The second PLL can be constructed by those skilled in the art of PLL design.

In one exemplary implementation, the components disposed within block 56 of FIG. 4 are implemented in a common integrated circuit. In that case, the PLL filter 26 and VCXO 28 are external to the integrated circuit.

Many existing low power, high linearity DAC architectures can be used for tracking and holding the VCO tuning voltage and can be designed by those skilled in the art. In one embodiment, DAC 66 is a sub-ranging DAC as shown in FIG. 6. which is based on the classical resistive divider architecture. DAC 66 includes a coarse stage 60A and a fine stage 60B. Each stage includes an array of 32 resistors and associated switches (not designated), with the state of the switches being controlled by a digital control block 88.
The control signals for the coarse stage 60A are derived by the control block 88 from the 5 MSBs of the 10 bit DAC control word. The control signals for the fine stage 60V are derived by control block 88 from the 5 LSBs of the control word. The coarse stage 60A receives a reference voltage Vref from a voltage reference source (not depicted). The coarse stage 60A divides reference voltage Vref into 32 subranges, with the control signals derived from the 5 LSBs determining which of the 32 subranges is applied to the upper and lower terminals 90A and 90B of the fine stage 60B resistive divider. The DAC output voltage is then chosen by closing the appropriate switch in the fine stage 60B, thereby connecting the desired tap on the resistive divider to the DAC output buffer 68.

The buffer 68, switch 74 and comparator 70 of FIG. 5 are also depicted in FIG. 6, with some additional components being shown. By way of example, a low pass filter 92 is disposed intermediate the DAC output 91 and buffer 68. The buffer 68 includes a resistance 94 to improve the capacitive driving capability of the buffer. In addition, the non-inverting input of comparator 70 is also connected to a low pass filter 96. These various components operate to reduce switching transients and to lower the noise bandwidth of the circuit.

In order to ensure accurate tracking, it is important that the DAC 66 be monotonic and have a low differential non-linearity (DNL) error value. Further, to achieve low phase noise on the output clock CLKO in the holdover mode, DAC 66 and its buffer 68 should be optimized for reduced low-frequency noise. The holdover clock CLKO frequency accuracy is related to the VCXO tuning sensitivity, the DAC 66 resolution, the DAC 66 accuracy, supply and ambient temperature variation and the variation of the VCXO characteristics over temperature, etc.

Assuming that the ambient temperature does not change significantly during the holdover mode, the measured holdover frequency accuracy using the approach of FIG. 4 is within +/−3 ppm for three different test parts evaluated over supply and temperature variations using a commercial 153.6 MHz VCXO (tuning gain Kvcxo of 100 ppm/V) from Epson Toyocom. This holdover accuracy is about ten times better that that of the prior art method of FIG. 3 where the tuning voltage is held at VDD/2 when in the holdover mode.

Thus, an improved clock conditioning system has been disclosed. Although an exemplary embodiment of the system has been described in some detail, it is to be understood that various changes can be made by those skilled in the art without departing from the spirit and scope of the present invention as defined by the appended claims.

What is claimed is:

1. A clock conditioning circuit comprising:
a phase detector circuit configured to provide an analog tuning signal indicative of a phase relationship between a reference clock to be conditioned and a generated clock;
a controlled oscillator configured to produce the generated clock, with the generated clock having an output frequency adjustable in response to an analog tuning signal applied to a control signal input of the controlled oscillator;
mode control circuitry switchable between at least two modes, including a tracking mode and a holdover mode, with the mode control circuitry operating in the tracking mode to couple the analog tuning signal to the control signal input of the controlled oscillator and with the mode control circuitry operating in the holdover mode to couple an analog holdover signal to the control signal input of the controlled oscillator; and
converter circuitry configured to produce a digital representation of the analog tuning signal when the mode control circuitry is in the tracking mode and to provide the analog holdover signal to the control signal input when the mode control circuitry is in the holdover mode, with the analog holdover signal being based upon one of the digital representations produced when the mode control circuitry was in the tracking mode.

2. The clock conditioning circuit of claim 1 wherein the mode control circuitry operating in the holdover mode operates to isolate the output of the phase detector from the control signal input of the controlled oscillator.

3. The clock conditioning circuit of claim 2 wherein the phase detector circuit includes a phase measurement circuit which receives the reference clock and the generated clock and produces at least one digital output signal having a pulse width relating to a phase difference between the reference clock and the generated clock.

4. The clock conditioning circuit of claim 3 where the phase detector further includes a charge pump circuit followed by a low pass filter, with the charge pump circuit delivering a charge to the low pass filter, with the charge being determined by the pulse width of the digital output signal of the phase measurement circuit.

5. The clock conditioning circuit of claim 4 further including a first frequency divider circuit having an input that receives the generated clock and an output coupled to an input of the phase detector circuit.

6. The clock conditioning circuit of claim 5 further including a second frequency divider circuit having an input that receives the reference clock and an output coupled to another input of the phase detector circuit.

7. The clock conditioning circuit of claim 1 further including a clock failure detection circuit which causes the mode control circuitry to switch to the holdover mode after a reference clock has failed.

8. The clock conditioning circuit of claim 1 wherein the converter circuitry includes an analog to digital converter circuit having an analog input coupled to the control signal input when the mode control circuitry is in the tracking mode, with the analog to digital converter operating to produce the digital representation of the analog tuning signal.

9. The clock conditioning circuit of claim 8 wherein the converter circuitry includes a digital to analog converter circuit which produces the analog holdover signal when the mode control circuitry is in the holdover mode based upon a digital input produced by the analog to digital converter circuit when the mode control circuitry was in a previous tracking mode.

10. The clock conditioning circuit of claim 9 wherein the analog to digital converter includes the digital to analog converter.

11. The clock conditioning circuit of claim 1 wherein the controlled oscillator is a voltage controlled oscillator.

12. A method of conditioning a clock signal comprising:
producing an analog tuning signal indicative of a phase difference between a reference clock to be conditioned and a generated clock;
providing a controlled oscillator to produce the generated clock, with the generated clock being generated in response to an analog signal applied to a control input of the controlled oscillator;
operating in a tracking mode of operation where the analog tuning signal is coupled to the control input of the controlled oscillator;
generating a digital representation of the analog tuning signal during the tracking mode of operation; and
switching to a holdover mode of operation where the analog tuning signal is replaced with an analog holdover signal, with the analog holdover signal being generated based upon the digital representation of the analog tuning signal generated during the previous tracking mode of operation.

13. The method of claim 12 wherein the switching to the holdover mode of operation is in response to a loss of the reference clock.

14. The method of claim 13 further including switching back to the tracking mode of operation from the holdover mode of operation in response to a return of the reference clock.

15. The method of claim 14 wherein the analog holdover signal is generated using a digital to analog converter and wherein the digital representation of the analog tuning signal is produced using the digital to analog converter.

16. The method of claim 12 wherein the step of producing an analog tuning signal includes dividing a frequency of the generated clock.

17. The method of claim 12 wherein the step of producing an analog tuning signal includes dividing a frequency of the reference clock.

18. A clock conditioning circuit for use with a controlled oscillator configured to produce a generated clock, with the generated clock having an output frequency adjustable in response to an analog tuning signal applied to a control signal input of the controlled oscillator, said clock conditioning circuit comprising:
a phase detector circuit configured to provide, when a controlled oscillator is present, the analog tuning signal indicative of a phase relationship between a reference clock to be conditioned and the generated clock;
mode control circuitry switchable between at least two modes, including a tracking mode and a holdover mode, so that when a controlled oscillator is present and the mode control circuitry is operating in the tracking mode, the analog tuning signal is coupled to the control signal input of the controlled oscillator and so that when a controlled oscillator is present and the mode control circuitry is operating in the holdover mode, an analog holdover signal is coupled to the control signal input of the controlled oscillator; and
converter circuitry configured to produce a digital representation of the analog tuning signal when the mode control circuitry is in the tracking mode and to provide the analog holdover signal to the control signal input when the mode control circuitry is in the holdover mode, with the analog holdover signal being based upon one of the digital representations produced when the mode control circuitry was in the tracking mode.

19. The clock conditioning circuit of claim 18 wherein the mode control circuitry operating in the holdover mode operates to isolate the output of the phase detector from the control signal input of the controlled oscillator when a controlled oscillator is present.

20. The clock conditioning circuit of claim 19 wherein the phase detector circuit includes a phase measurement circuit which receives the reference clock and the generated clock when a controlled oscillator is present and produces at least one digital output signal having a pulse width relating to a phase difference between the reference clock and the generated clock.

21. The clock conditioning circuit of claim 20 where the phase detector further includes a charge pump circuit, with the charge pump circuit delivering a total charge to an output of the charge pump circuit determined by the pulse width of the digital output signal of the phase measurement circuit.

22. The clock conditioning circuit of claim 21 further including a first frequency divider circuit having an input that receives the generated clock when a controlled oscillator is present and an output coupled to an input of the phase detector circuit.

23. The clock conditioning circuit of claim 22 further including a second frequency divider circuit having an input that receives the reference clock and an output coupled to another input of the phase detector circuit.

24. The clock conditioning circuit of claim 18 further including a clock failure detection circuit which causes the mode control circuitry to switch to the holdover mode after a reference clock has failed.

* * * * *